(12) United States Patent
Soyano

(10) Patent No.: US 8,441,117 B2
(45) Date of Patent: May 14, 2013

(54) SEMICONDUCTOR DEVICE

(75) Inventor: Shin Soyano, Shiojiri (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 13/369,393

(22) Filed: Feb. 9, 2012

(65) Prior Publication Data
US 2012/0181682 A1 Jul. 19, 2012

Related U.S. Application Data

(63) Continuation of application No. PCT/JP2011/055978, filed on Mar. 14, 2011.

(30) Foreign Application Priority Data

Mar. 16, 2010 (JP) ................................. 2010-058953

(51) Int. Cl.
*H01L 23/053* (2006.01)
(52) U.S. Cl.
USPC .... 257/693; 257/698; 257/704; 257/E23.078; 257/E23.188
(58) Field of Classification Search .................. 257/693, 257/698, 704, E23.078, E23.188
See application file for complete search history.

(56) References Cited

U.S. PATENT DOCUMENTS

| 5,018,002 | A | * | 5/1991 | Neugebauer et al. | 257/698 |
|---|---|---|---|---|---|
| 5,103,290 | A | * | 4/1992 | Temple et al. | 257/698 |
| 5,166,773 | A | * | 11/1992 | Temple et al. | 257/678 |
| 5,285,106 | A | * | 2/1994 | Deie | 257/678 |
| 5,306,948 | A | * | 4/1994 | Yamada et al. | 257/690 |
| 5,901,050 | A | * | 5/1999 | Imai | 361/820 |
| 6,011,302 | A | | 1/2000 | Nakahira | |
| 6,225,694 | B1 | * | 5/2001 | Terui | 257/704 |
| 8,030,749 | B2 | | 10/2011 | Soyano et al. | |
| 2005/0017348 | A1 | * | 1/2005 | Haba et al. | 257/704 |
| 2005/0087861 | A1 | * | 4/2005 | Burtzlaff et al. | 257/704 |
| 2005/0269688 | A1 | * | 12/2005 | Shiv | 257/704 |
| 2009/0096081 | A1 | | 4/2009 | Soyano | |
| 2009/0140414 | A1 | * | 6/2009 | Soyano et al. | 257/698 |

FOREIGN PATENT DOCUMENTS

| JP | 06-188335 A | 7/1994 |
|---|---|---|
| JP | 10-256319 A | 9/1998 |
| JP | 10-335523 A | 12/1998 |
| JP | 2001-196487 A | 7/2001 |

(Continued)

OTHER PUBLICATIONS

International Search Report for PCT/JP2011/055978, mailing date Apr. 12, 2011.

*Primary Examiner* — George Fourson, III
(74) *Attorney, Agent, or Firm* — Rossi, Kimms & McDowell LLP

(57) ABSTRACT

In some aspects of the invention, an insulating substrate fixed onto a metal base plate can include an insulating plate and metal foils. A semiconductor element can be disposed on each of the metal foils. External connection terminals can be fixed to a set of ends of terminal holders, respectively. The other ends of the terminal holders can be bonded to the metal foils, respectively. External connection terminals which are main terminals through which main current flows are disposed on a lid. By preparing a plurality of lids having different layouts of the external connection terminals, in which the external connection terminals are connected to the terminal holders in the resin case, respectively, and exchanging the lids, the positions of the external connection terminals can be easily changed.

11 Claims, 12 Drawing Sheets

FOREIGN PATENT DOCUMENTS

| | | |
|---|---|---|
| JP | 2003-289130 A | 10/2003 |
| JP | 2009-081255 A | 4/2009 |
| JP | 2009-099645 A | 5/2009 |
| JP | 2009-141000 A | 6/2009 |

\* cited by examiner

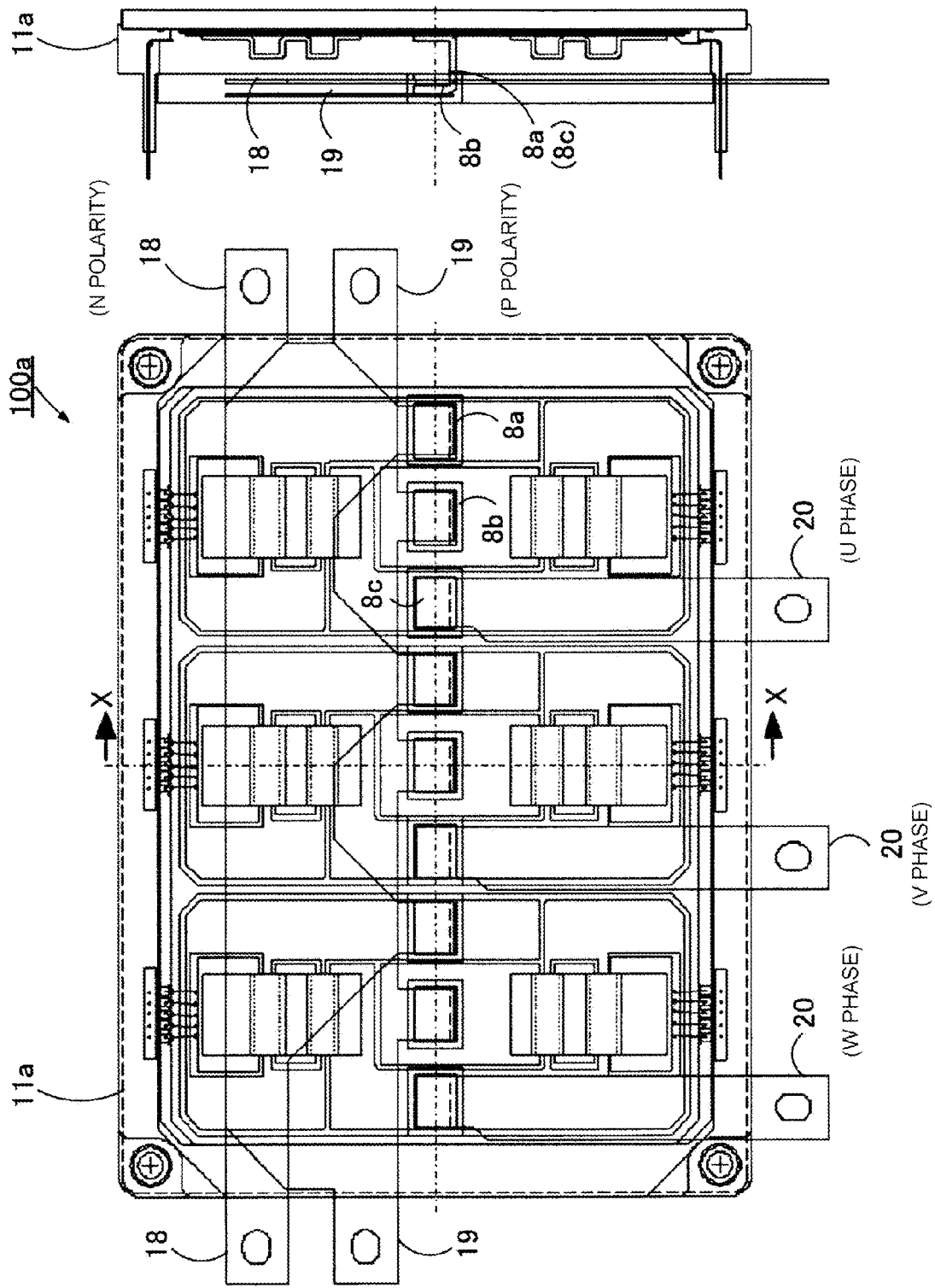

SEMICONDUCTOR DEVICE

CROSS-REFERENCE TO RELATED APPLICATIONS

This application is a continuation of International Application No. PCT/JP2011/055978, filed on Mar. 14, 2011, which is based on and claims priority to Japanese Patent Application No. JP 2010-058953, filed on Mar. 16, 2010. The disclosure of the Japanese priority application and the PCT application in their entirety, including the drawings, claims, and the specification thereof, are incorporated herein by reference.

BACKGROUND OF THE INVENTION

A. Field of the Invention

Embodiments of the invention relate to semiconductor devices and, in particular, to semiconductor devices used with wiring terminals.

B. Description of the Related Art

In an apparatus such as an inverter apparatus, an uninterruptible power supply, a machine tool, and an industrial robot, a semiconductor device (general-purpose module), including power semiconductor elements mounted therein, is used independently of a main body of the apparatus. Such a semiconductor device can have a structure in which a plurality of power semiconductor elements is sealed (packaged) in a resin case. Internal wiring of such a semiconductor device is generally realized by wiring terminals (lead frames).

FIG. 11 is a configuration view illustrating main parts of a semiconductor device of the related art, including a power semiconductor element packaged in a resin case. FIG. 11 illustrates an example of a semiconductor device in which internal wiring is realized by wiring terminals. In the semiconductor device illustrated in FIG. 11, an Insulated Gate Bipolar Transistor (IGBT) device 501 is disposed in a resin case 503. Here, the IGBT element 501 is a vertical power semiconductor element in which an emitter electrode is provided on the upper surface thereof and a collector electrode is provided on the lower surface thereof (not shown). The emitter electrode of the IGBT element 501 is electrically connected to a wiring substrate 502 through a wiring terminal 504. The collector electrode of the IGBT element 501 is electrically connected to the wiring substrate 502 through direct contact.

The bonding between the wiring terminal 504 and the emitter electrode and between the wiring terminal 504 and the wiring substrate 502 is generally realized, for example, by soldering, ultrasonic bonding, or laser welding. An example of such a semiconductor device of the related art is disclosed in Japanese Patent Application No. 2009-141000 (also referred to herein as "Patent Literature 1"), for example. Next, a semiconductor device of the related art disclosed in Patent Literature 1 will be described in detail with reference to FIG. 12.

FIGS. 12A and 12B are configuration views illustrating a semiconductor device of the related art. FIG. 12A is a plan view of main parts of a semiconductor device 500. FIG. 12B is a cross-sectional view of main parts taken along the line X-X in FIG. 12A as viewed from the direction indicated by arrows. FIGS. 12A and 12B illustrate an example of a semiconductor module corresponding to one phase of an inverter circuit.

A semiconductor device 500 illustrated in FIGS. 12A and 12B includes a plurality of external connection terminals 53, 54, 55, 56, 57, and 58 that is fixed and supported on a resin case 63, IGBT elements 51a and 51b and Free Wheeling Diode (FWD) devices 52a and 52b that are packaged in the resin case 63, and a terminal block 60 in which wiring terminals 59 are disposed so as to electrically connect these semiconductor elements to any one of the external connection terminals 53, 54, 55, 56, 57, and 58. The wiring terminals 59 are connected to the IGBT elements 51a and 51b and the FWD elements 52a and 52b through terminal holders 61. The emitter electrodes of the IGBT elements 51a and 51b are connected to the anode electrodes of the FWD elements 52a and 52b by terminals 62a and 62b, respectively. With this configuration, the layout of the wiring terminals 59 in the resin case 63 of the semiconductor device 500 in which a plurality of semiconductor elements is packaged in the resin case 63 can be changed easily. By changing the layout of the wiring terminals 59, the external connection terminals 53, 54, 55, 56, 57, and 58 which will be used actually can be selected (see, for example, Patent Literature 1).

As another apparatus, a semiconductor device (module) is disclosed in which a lid having a nut holder that holds a nut provided on the upper surface of a case includes a lid chassis unit and a lid cartridge unit which are separated from each other. In this semiconductor device, by preparing lid cartridge units having nut holders corresponding to various nut dimensions and exchanging the lid cartridge units, it is possible to change an attachment nut so as to meet the specifications of users. See, for example, Japanese Patent Application No. 2009-81255 (also referred to herein as "Patent Literature 2").

As still another apparatus, the following semiconductor device is disclosed. A mounting substrate is bonded to a radiator plate. The mounting substrate has conductor patterns on both surfaces thereof. A semiconductor chip is soldered to the surface of a base conductor. A thin wire electrode group is in contact with the emitter electrode of the semiconductor chip. A probe holder brings spherical contact portions of the thin wire electrode group attached in parallel to an attachment board into pressure-contact with the emitter electrode. The thin wire electrode group is inserted into and held by the insulating probe holder, whereby the contact pressure in relation to the emitter electrode is set. The probe holder is held appropriately by a collector lead-out conductor and a supporting conductor and sealed in a resin case using a terminal capacitor. With such a structure, a semiconductor device exhibits excellent power cycling performance and thermal fatigue properties. This semiconductor device has a structure in which main terminals protrude from the central part of a lid (terminal capacitor) that covers the resin case. See, for example, Japanese Patent Application No. JP-A No. 10-256319 (also referred to herein as "Patent Literature 3").

As still another apparatus, a semiconductor device is disclosed in which a semiconductor chip is fixed to a U-shaped electrode portion, main terminals are connected to the U-shaped electrode portion, and the main terminals protrude from the central portion of the ceiling of a resin case. The U-shaped electrode portion is interposed between the semiconductor chip and the main terminals to thereby improve mechanical strength and reduce thermal stress applied to the semiconductor chip. See, for example, Japanese Patent Application No. JP-A No. 6-188335 (also referred to herein as "Patent Literature 4").

However, the techniques disclosed in Patent Literatures 1 to 4 have the following problems. In the semiconductor device 500 disclosed in Patent Literature 1, the wiring terminals 59 are connected to the terminal holders 61 disposed at the central part of the resin case 63. The terminal holders 61 are locations to which AC outputs of an inverter circuit, for example, are output. Thus, the positions of the external connection terminals 56 and 58 of the main terminals serving as the AC output terminals, for example, can be easily changed by changing the terminal block 60. In contrast, the external connection terminals 54 and 57 including a P terminal and a N terminal which are the main terminals of an inverter circuit are fixed to an insulating substrate 64 in the resin case 63 through a connection terminal 65. Thus, in order to change the positions of the external connection terminals 54 and 57, it is necessary to change the positions in each resin case 63. Thus, the change of the external connection terminals is not typically easy to perform.

In the techniques disclosed in Patent Literatures 2 to 4, in any of the semiconductor devices, although the main terminals are disposed at the central part, the main terminals are fixed directly to the semiconductor element. Thus, it is typically not easy to change the positions of the external connection terminals which are the main terminals.

Thus, there is a need in the art to address the above-described problems in the art.

SUMMARY OF THE INVENTION

Embodiments of the present invention address these and other needs. In order to solve the problems of the related art described above, embodiments of the invention provide a semiconductor device in which the positions of external connection terminals can be changed easily.

According to an aspect of the invention, there is provided a semiconductor device including a resin case, an insulating lid fixed and supported on the resin case; an insulating substrate which is housed in the resin case and which includes a plurality of conductive patterns, a semiconductor element fixed to at least one of the conductive patterns, a plurality of connection conductors connecting the conductive patterns together and connecting surface electrodes of the semiconductor element and the conductive patterns; terminal holders connected to the conductive patterns and external connection terminals connected to the terminal holders, wherein the lid includes the external connection terminals and a lid plate that fixes and supports the external connection terminals.

According to the above aspect of the invention, by changing the lid, the positions of the external connection terminals can be easily changed.

According to another aspect of the invention, there is provided a semiconductor device including a resin case, an insulating lid fixed and supported on the resin case; an insulating substrate which is housed in the resin case and which includes a plurality of conductive patterns, a semiconductor element fixed to at least one of the conductive patterns, a plurality of connection conductors connecting the conductive patterns together and connecting surface electrodes of the semiconductor element and the conductive patterns, a resin plate which bridges openings of the resin case and which is fixed to inner walls of the resin case; conductors disposed on the resin plate; terminal holders connected to the conductors and external connection terminals connected to the terminal holders, wherein the lid includes the external connection terminals and a lid plate that fixes and supports the external connection terminals.

According to the above aspect of the invention, by changing the lid, the positions of the external connection terminals can be easily changed. Moreover, since the area of the insulating substrate can be decreased, it is possible to reduce the manufacturing cost.

In the semiconductor device according to the above aspect of the invention, the lid plate may include an opening, the opening may be formed at a central part of the lid plate, and the external connection terminals and the terminal holders exposed from the opening may be connected to each other.

According to the above aspect of the invention, by irradiating laser light from the opening of the lid plate, the external connection terminals can be fixed to the terminal holders by laser welding.

In the semiconductor device according to the above aspect of the invention, the terminal holders may be parts of the conductors.

According to some aspects of the invention, it is not necessary to bond the terminal holders and the conductors by soldering or the like, and the manufacturing cost can be decreased.

In the semiconductor device according to the above aspect of the invention, the conductive patterns may include a first conductive pattern, a second conductive pattern, and a third conductive pattern. The semiconductor element may include a first IGBT element, a second IGBT element, a first FWD element, and a second FWD element; the terminal holders may include a first terminal holder, a second terminal holder, and a third terminal holder; a collector electrode of the first IGBT element and a cathode electrode of the first FWD element may be fixed to the first conductive pattern, a collector electrode of the second IGBT element and a cathode electrode of the second FWD element may be fixed to the second conductive pattern, an emitter electrode of the first IGBT element and an anode electrode of the first FWD element may be electrically connected to the second conductive pattern, an emitter electrode of the second IGBT element and an anode electrode of the second FWD element may be electrically connected to the third conductive pattern, the first terminal holder may be connected to the first conductive pattern, the second terminal holder may be connected to the second conductive pattern, the third terminal holder may be connected to the third conductive pattern; and at least one external connection terminal may be connected to each of the first terminal holder, the second terminal holder, and the third connector.

In the semiconductor device according to the above aspect of the invention, the conductive patterns may include the first conductive pattern, the second conductive pattern, and the third conductive pattern, the semiconductor element may include the first IGBT element, the second IGBT element, the first FWD element, and the second FWD element. The terminal holders may include the first terminal holder, the second terminal holder, and the third terminal holder. The conductors may include a first conductor, a second conductor, and a third conductor, a collector electrode of the first IGBT element and a cathode electrode of the first FWD element may be fixed to the first conductive pattern, a collector electrode of the second IGBT element and a cathode electrode of the second FWD element may be fixed to the second conductive pattern; the first conductive pattern and the first conductor may be electrically connected to each other, an emitter electrode of the first IGBT element, an anode electrode of the first FWD element and the second conductive pattern may be electrically connected to the second conductor. An emitter electrode of the second IGBT element and an anode electrode of the second FWD element may be electrically connected to the third conductor, the first terminal holder may be connected to the first conductor, the second terminal holder may be connected to the second conductor. The third terminal holder may be connected to the third conductor and at least one external connection terminal may be connected to each of the first terminal holder, the second terminal holder, and the third terminal holder.

In the semiconductor device according to the above aspect of the invention, the terminal holders and the external connection terminals may be fixed by ultrasonic bonding, laser welding, or soldering.

In the semiconductor device according to the above aspect of the invention, the semiconductor device may further include a group of three conductive patterns including a first conductive pattern, a second conductive pattern, and a third conductive pattern, the semiconductor elements including a first semiconductor element fixed to the first conductive pattern and a second semiconductor element fixed to the second conductive pattern; the third conductive pattern formed between the first conductive pattern and the second conductive pattern, the terminal holders including a first terminal holder, a second terminal holder and a third terminal holder which are connected to the first conductive pattern, the second conductive pattern, and the third conductive pattern, respectively and the external connection terminals which are connected to the first terminal holder, the second terminal holder, and the third terminal holder, respectively, and of which the end portions protrude outward from the resin case.

In the semiconductor device according to the above aspect of the invention, the semiconductor device may further include the conductive patterns including a first conductive pattern and a second conductive pattern, the insulating substrate including a first insulating substrate having the first conductive pattern and a second insulating substrate having the second conductive pattern, the semiconductor elements including a first semiconductor element fixed to the first conductive pattern and a second semiconductor element fixed to the second conductive pattern, a resin plate disposed between the first insulating substrate and the second insulating substrate; a group of three conductors including a first conductor, a second conductor, and a third conductor, disposed on the resin plate; the terminal holders including a first terminal holder, a second terminal holder, and a third terminal holder which are connected to the first conductive pattern, the second conductive pattern, and the third conductive pattern, respectively; and the external connection terminals which are connected to the first terminal holder, the second terminal holder, and the third terminal holder, respectively, and of which the end portions protrude outward from the resin case.

According to the above aspect of the invention, by preparing a plurality of lids having different layouts of the external connection terminals, in which all external connection terminals which are main terminals through which main current flows are disposed in the lid, and these external connection terminals are connected to the terminal holders in the resin case, respectively, and exchanging the lids, the positions of the external connection terminals can be changed easily.

Moreover, by setting the positions of the terminal holders to the central part of the resin case, it is possible to decrease the wiring inductance in the resin case. Moreover, since the openings are formed at the central part of the lid plate and, laser light irradiates from the openings, the external connection terminals and the terminal holders can be easily laser-welded. Furthermore, by disposing the external connection terminals which serve as P and N terminals, for example, in a parallel flat plate-like shape, it is possible to decrease the wiring inductance.

Thus, according to the semiconductor device of embodiments of the invention, it is possible to provide a semiconductor device in which the position of an external connection terminal can be easily changed.

BRIEF DESCRIPTION OF THE DRAWINGS

FIGS. 7A and 7B are configuration views illustrating another example of the semiconductor device according to the first embodiment of the invention;

DETAILED DESCRIPTION

Figure 1A:
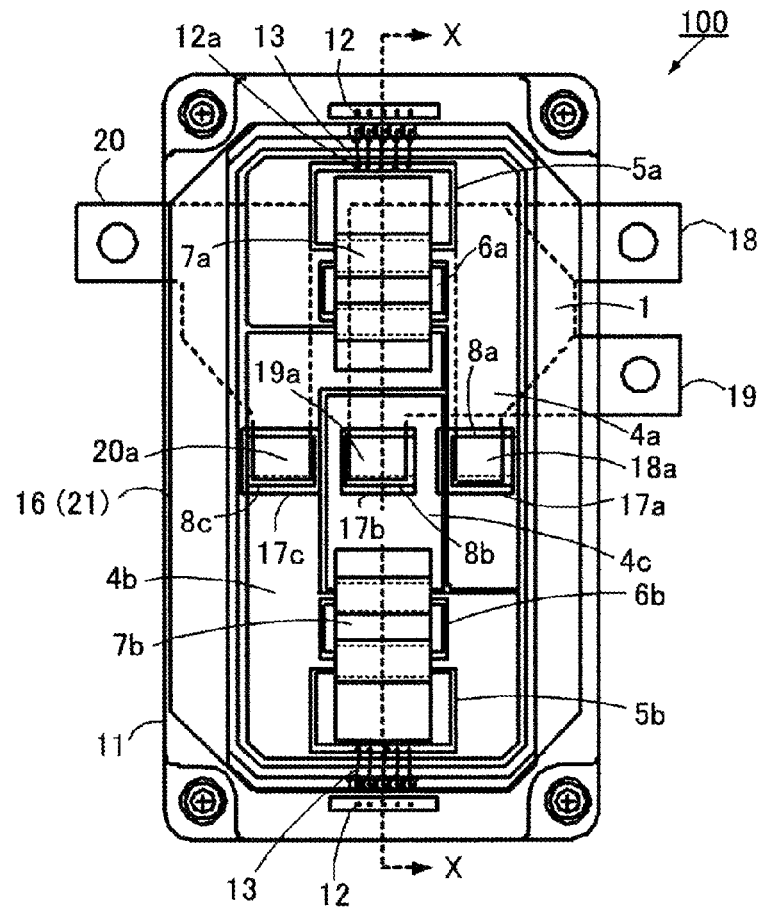
FIGS. 1A and 1B are configuration views illustrating a semiconductor device according to a first embodiment of the invention.

Hereinafter, embodiments of a semiconductor device according to the invention will be described in detail with reference to the accompanying drawings. In the following description of the embodiments and the accompanying drawings, the same constituent elements will be denoted by the same reference numerals, and redundant description thereof will not be provided.

First Embodiment

Figure 1B:
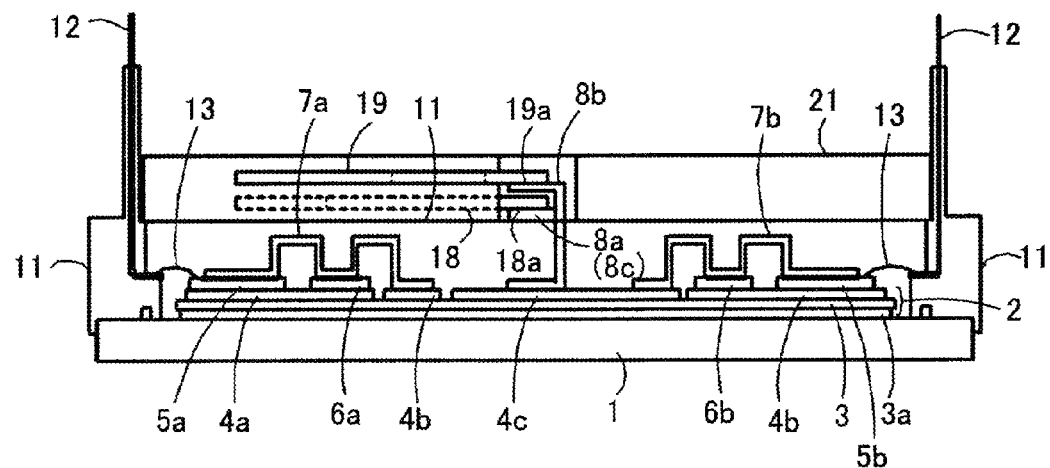
Figure 2A:
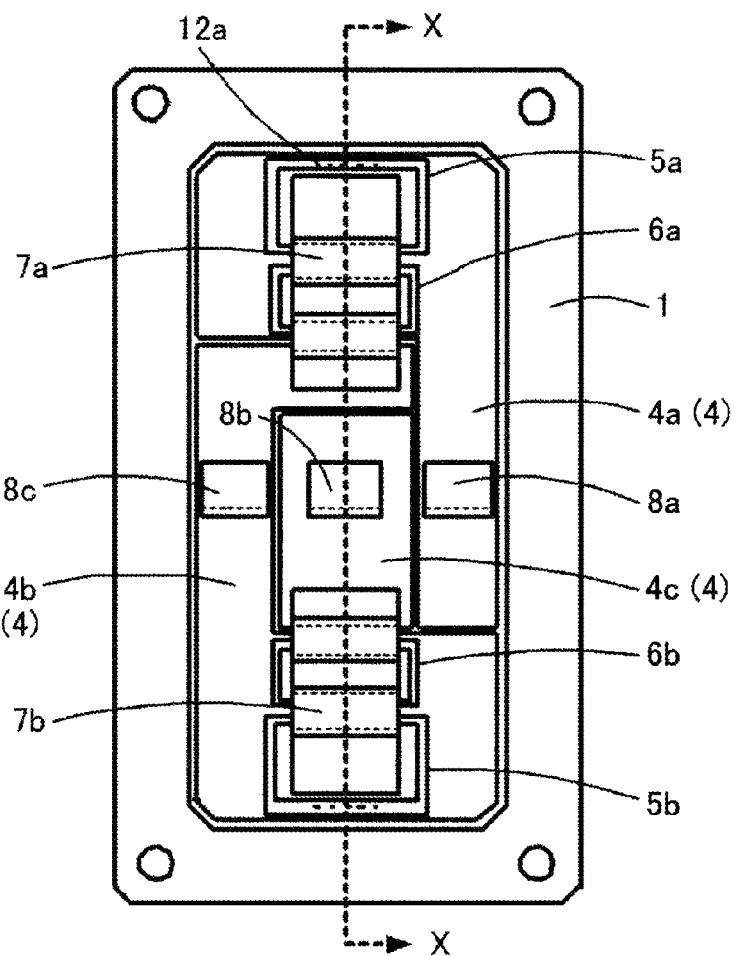
FIGS. 2A and 2B are configuration views illustrating members constituting the semiconductor device according to the first embodiment of the invention.
Figure 2B:
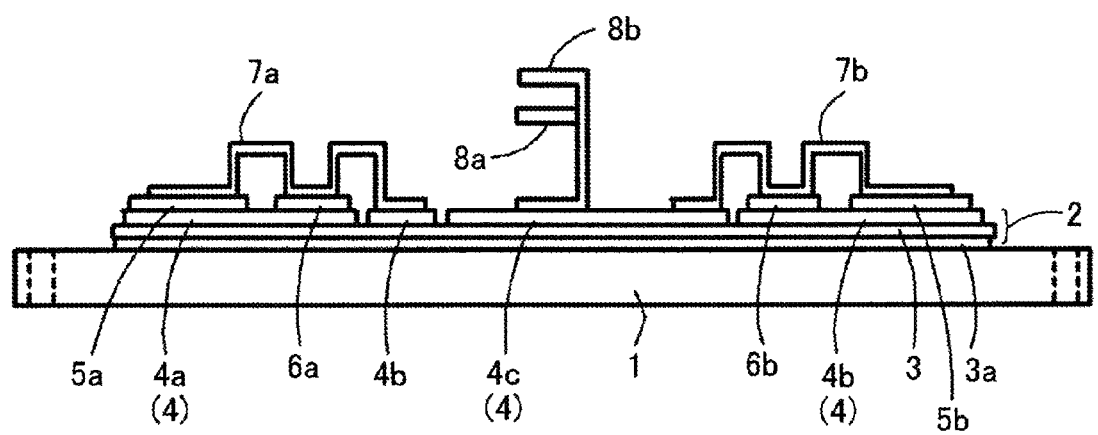
Figure 3A:
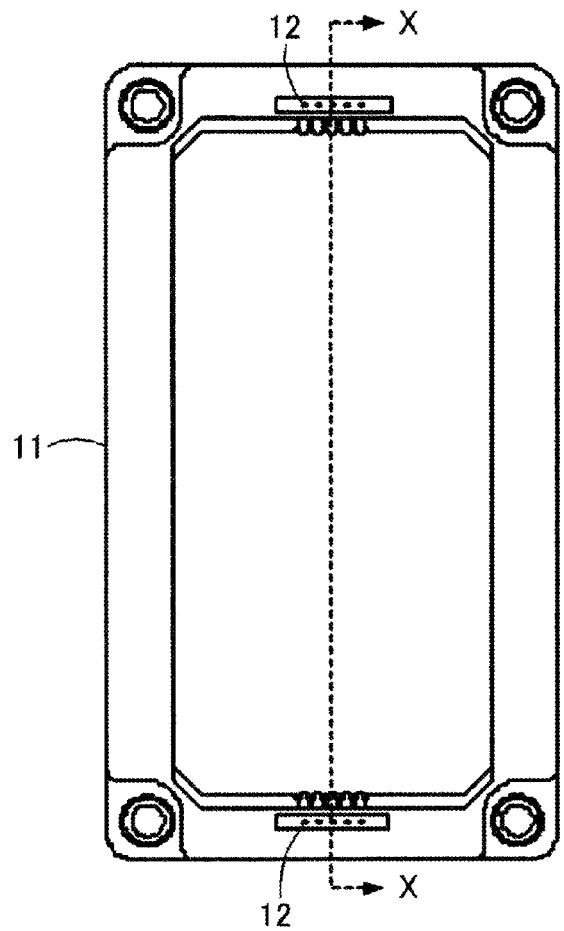
FIGS. 3A and 3B are configuration views illustrating members constituting the semiconductor device according to the first embodiment of the invention.
Figure 3B:
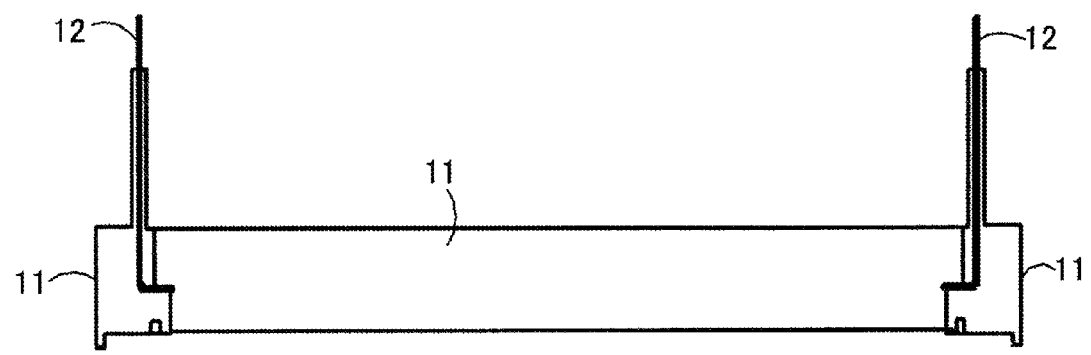
Figure 4A:
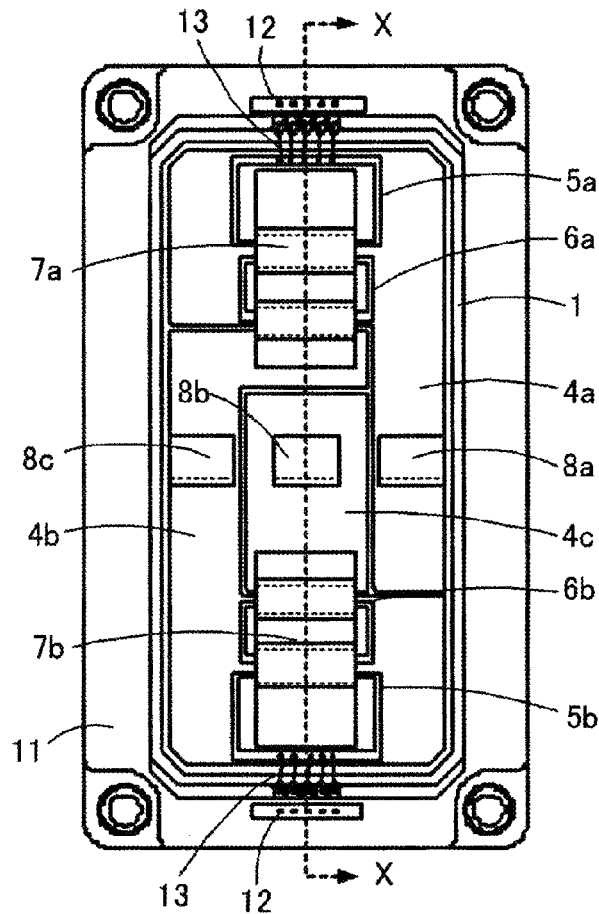
FIGS. 4A and 4B are configuration views illustrating members constituting the semiconductor device according to the first embodiment of the invention.
Figure 4B:
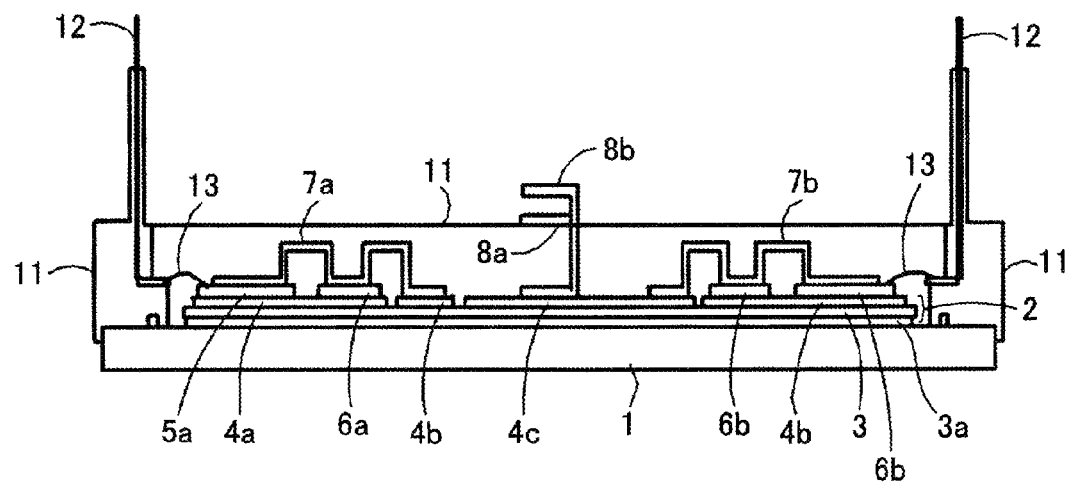
Figure 5A:
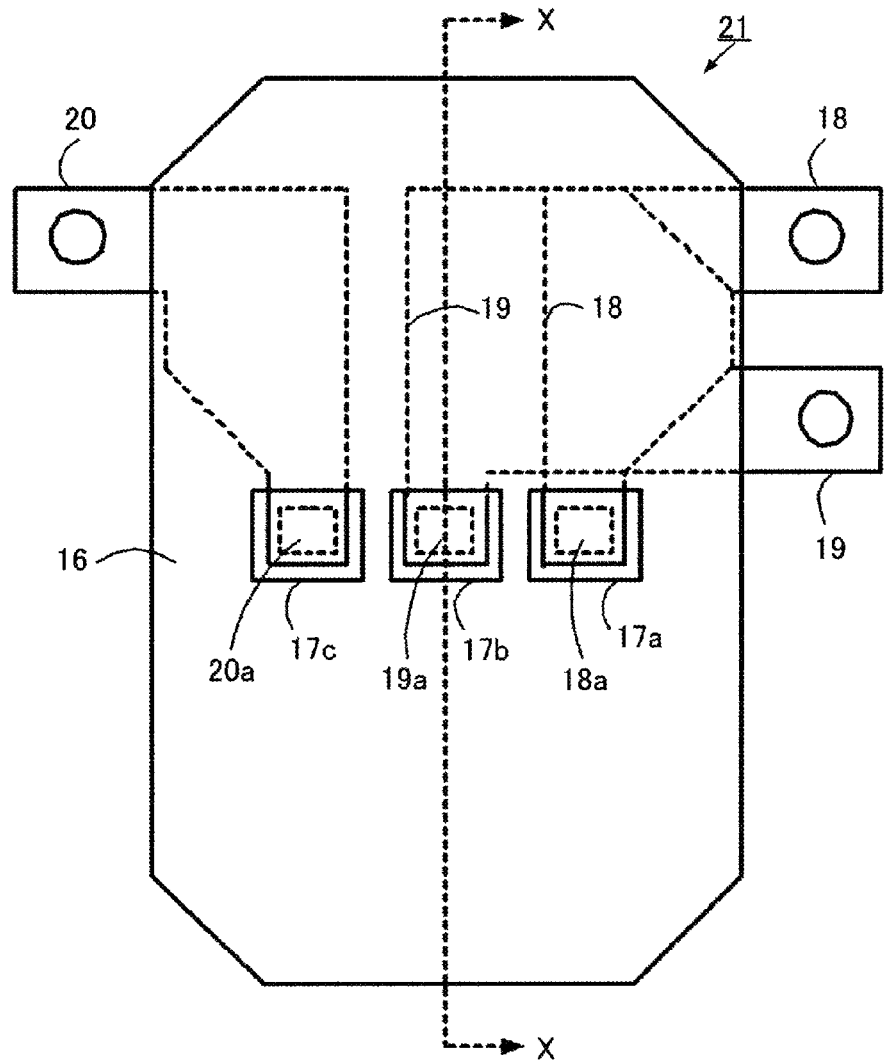
FIGS. 5A and 5B are configuration views illustrating members constituting the semiconductor device according to the first embodiment of the invention.
Figure 5B:
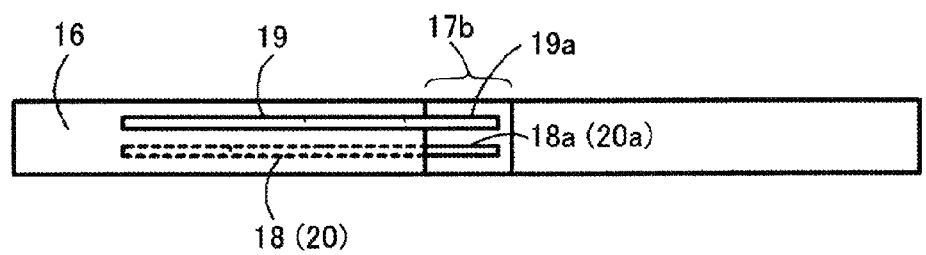

FIGS. 1A and 1B are configuration views showing a semiconductor device according to a first embodiment of the invention. Moreover, FIGS. 2A to 5B are configuration views showing members constituting the semiconductor device according to the first embodiment of the invention. FIGS. 1A and 1B are overall configuration views after a semiconductor device 100 is assembled. FIGS. 2A and 2B are configuration views of an insulating substrate 2 to which semiconductor elements are fixed. FIGS. 3A and 3B are configuration views of a resin case 11. FIGS. 4A and 4B are configuration views of the insulating substrate 2 and the resin case 11 which are fixed to a metal base plate 1. FIGS. 5A and 5B are configuration views of a lid 21 in which external connection terminals 18 to 20 are inserted into a lid plate 16. In FIGS. 1A to 5B, FIGS. 1A to 5A are plan views of main parts, and FIGS. 1B to 5B are cross-sectional views of main parts taken along the line X-X in FIGS. 1A to 5A as viewed from the direction of arrows.

FIG. 1A is a layout view of main parts within the resin case 11 when the lid 21 is seen through. In this embodiment, an example of a semiconductor module corresponding to one phase of an inverter circuit is illustrated. A semiconductor device 100 shown in FIGS. 1A and 1B includes the metal base plate 1 having a thickness of several millimeters as a substrate. The insulating substrate 2 is fixed to the metal base plate 1 through a lead-free tin-silver (Sn—Ag) solder layer (not shown).

The insulating substrate 2 includes conductive patterns on a surface (hereinafter referred to as an upper surface) on the opposite side of a surface close to the metal base plate 1. IGBT elements 5a and 5b and FWD elements 6a and 6b which are power semiconductor elements are antiparallel-connected and mounted on the upper surface side of the insulating substrate 2, respectively (FIGS. 2A and 2B). The semiconductor device 100 functions as a general-purpose IGBT element module (power module) in which the semiconductor elements and the like are packaged in the resin case 11 (see FIGS. 4A and 4B).

The insulating substrate 2 includes an insulating plate 3, a metal foil 3a formed on the lower surface (a surface close to the metal base plate 1) of the insulating plate 3 by a direct copper bonding (DCB) method, and a metal foil 4 (4a, 4b, and 4c) which is a conductive pattern formed on the upper surface of the insulating plate 3 similarly by the DCB method.

Furthermore, collector electrodes of the IGBT elements 5a and 5b are fixed to the metal foils 4a and 4b of the insulating substrate 2 through a solder layer (not shown), respectively. Emitter electrodes are formed on the principal surface of the IGBT elements 5a and 5b on the opposite side of the collector electrodes, namely on the upper surface side of the IGBT elements 5a and 5b. A control electrode 12a which is connected to a control terminal 12 through a wire 13 is disposed on a part of the upper surface side of the IGBT elements 5a and 5b. The control terminal 12 is fixed and supported on the resin case 11.

The cathode electrodes of the FWD elements 6a and 6b are fixed to the metal foils 4a and 4b of the insulating substrate 2 through a solder layer (not shown), respectively. The FWD element 6a is disposed so as to be separated from the IGBT elements 5a. The FWD element 6b is disposed so as to be separated from the IGBT elements 5b. Anode electrodes are formed on the principal surface of the FWD elements 6a and 6b on the opposite side of the cathode electrodes, namely on the upper surface side of the FWD elements 6a and 6b.

Moreover, the emitter electrodes of the IGBT elements 5a and 5b (the upper surface sides of the IGBT elements 5a and 5b) are connected to the anode sides of the FWD elements 6a and 6b (the upper surface side of the FWD elements 6a and 6b) by connection terminals (connection conductors) 7a and 7b, respectively. Specifically, the connection terminal 7a is in contact with the IGBT element 5a and the FWD element 6a. The connection terminal 7b is in contact with the IGBT element 5b and the FWD element 6b. In this way, electrical connection between the emitter electrode of the IGBT element 5a and the anode electrode of the FWD element 6a and electrical connection between the emitter electrode of the IGBT element 5b and the anode electrode of the FWD element 6b are secured.

Furthermore, the connection terminals 7a and 7b are connected to the metal foils 4b and 4c, respectively, which are formed in the resin case 11 by patterning. Moreover, the collector electrode of the IGBT element 5a and the cathode electrode of the FWD element 6a are electrically connected to each other through the metal foil 4a which is the base of the IGBT element 5a and the FWD element 6a. The collector electrode of the IGBT element 5b and the cathode electrode of the FWD element 6b are electrically connected to each other through the metal foil 4b which is the base of the IGBT element 5b and the FWD element 6b. The emitter electrode of the IGBT element 5a, the collector electrode of the IGBT element 5b, the anode electrode of the FWD element 6a, and the cathode electrode of the FWD element 6b are electrically connected to each other through the connection terminal 7a and the metal foil 4b.

Moreover, the insulating plate 3 is formed of ceramics made of an alumina ($Al_2O_3$)-sintered body, for example. The metal foils 4a, 4b, and 4c are formed of metal containing copper (Cu) as its main component. The connection terminals 7a and 7b are formed of material containing copper (Cu), aluminum (Al), or alloys thereof, for example, as its main component. A bonding wire may be used instead of the connection terminals 7a and 7b.

A semiconductor element mounted on the metal foils 4a and 4b is not limited to the IGBT elements 5a and 6b described above, and a power metal oxide semiconductor field effect transistor (MOSFET) may be used.

In the semiconductor device 100, the resin case 11 made of polyphenylene sulfide (PPS) shown in FIGS. 3A and 3B, for example, is provided on the upper edge of the metal base plate 1. Moreover, the insulating lid 21 which is fixed and supported on the resin case 11 is disposed above the metal base plate 1. As shown in FIGS. 5A and 5B, the external connection terminals 18, 19, and 20 which are electrically connected to the main electrodes of the IGBT elements 5a and 5b, for example, are insert-molded to the lid plate 16 in a part of the lid 21. The external connection terminals 18, 19, and 20 are pulled out from the side surface of the lid plate 16. The external connection terminals 18, 19, and 20 may be pulled out from the upper surface of the lid plate 16. Moreover, when the lid 21 is disposed in the resin case 11, the external connection terminals 18, 19, and 20 are disposed closer to the IGBT element 5a than the center of the resin case 11, for example. The lid plate 16 has an approximately rectangular planar shape, for example.

In the semiconductor device 100, the external connection terminals 18 and 19 are disposed so that the external connection terminal 18 serves as a positive input terminal (P terminal) of an inverter circuit, for example, and the external connection terminal 19 serves as a negative input terminal (N terminal) of the inverter circuit. Moreover, the external connection terminals 18 and 19 are electrically connected to the positive and negative electrodes, respectively, of a DC power supply which is provided at the outside of the semiconductor device 100. By disposing these external connection terminals 18, 19, and 20 in a parallel flat plate-like shape, it is possible to decrease wiring inductance and wiring resistance.

Moreover, the external connection terminal 20 is disposed so as to serve as an AC output terminal (for example, a U-phase terminal) of the inverter circuit. An end portion of each of the external connection terminals 18, 19, and 20 in which an external connection hole is formed protrudes outward from the resin case 11 as shown in FIG. 1. The end portions of the external connection terminals 18 and 19 in which the external connection hole is formed protrude outward from one side wall of a pair of facing side walls of the lid 21, and the end portion of the external connection terminal 20 in which the external connection hole is formed protrudes outward from the other side wall. The end portions of the external connection terminals 18, 19, and 20 in which the external connection hole is formed may protrude outward from both side surfaces of a pair of neighboring side walls of the lid 21.

Although the circuit configuration has been described by way of an example of the inverter circuit, the circuit configuration is not limited to the inverter circuit but may be applied to other power conversion circuits such as a chopper circuit.

For example, connection portions 18a, 19a, and 20a of the end portions of the external connection terminals 18, 19, and 20 exposed from openings 17a, 17b, and 17c of the lid plate 16 are fixed to a set of ends (the upper side in FIG. 1A) of the terminal holders 8a, 8b, and 8c, respectively, by soldering or the like. The other ends (the lower side in FIG. 1A) of the terminal holders 8a, 8b, and 8c are bonded to the metal foils 4a, 4b, and 4c, respectively, by soldering or the like. In the terminal holders shown in FIGS. 1A and 1B, the terminal holders 8a and 8c have the same height, and the height of the terminal holder 8b is higher than that of the terminal holders 8a and 8c. The three terminal holders 8a, 8b, and 8c may have different heights. Moreover, the terminal holders 8a, 8b, and 8c may be disposed at the central portion of the resin case 11, for example. The openings 17a, 17b, and 17c of the lid plate 16 may be formed at the central portion of the lid plate 16, for example.

The openings 17a, 17b, and 17c formed in the lid plate 16 serve as insertion ports of a heat source when soldering the terminal holders 8a, 8b, and 8c to the external connection terminals 18, 19, and 20, respectively. As a method of bonding the terminal holders 8a, 8b, and 8c to the external connection terminals 18, 19, and 20, respectively, an ultrasonic bonding method and a laser welding method may be used. In this case, the openings 17a, 17b, and 17c of the lid plate 16 serve as insertion ports of a vibrator used for ultrasonic bonding or as irradiation ports of laser light used for laser welding when bonding or welding the terminal holders 8a, 8b, and 8c and the external connection terminals 18, 19, and 20 together. The openings 17a, 17b, and 17c may be buried by an epoxy resin or the like, for example, after the terminal holders 8a, 8b, and 8c are bonded to the external connection terminals 18, 19, and 20, respectively.

As above, in the semiconductor device 100, the external connection terminals 18, 19, and 20 and the metal foils 4a, 4b, and 4c which are fixed to the lid 21 are electrically connected to each other through the terminal holders 8a, 8b, and 8c, respectively. That is, the external connection terminals 18, 19, and 20 are electrically connected to any one of the collector electrodes and emitter electrodes of the IGBT elements 5a and 5b and the cathode electrodes and anode electrodes of the FWD elements 6a and 6b.

Specifically, the external connection terminal 18 is electrically connected to the collector electrode of the IGBT element 5a and the cathode electrode of the FWD element 6a through the terminal holder 8a and the metal foil 4a. Furthermore, the external connection terminal 18 is connected to the collector electrode of the IGBT element 5b and the cathode electrode of the FWD element 6b through the IGBT element 5a, the emitter electrodes of the IGBT element 5a, the FWD element 6a, the anode electrode of the FWD element 6a, the connection terminal 7a, and the metal foil 4b.

The external connection terminal 19 is electrically connected to the emitter electrode of the IGBT element 5b and the anode electrode of the FWD element 6b through the terminal holder 8b, the metal foil 4c, and the connection terminal 7b. Furthermore, the external connection terminal 19 is connected to the emitter electrode of the IGBT element 5a and the anode electrode of the FWD element 6a through the IGBT element 5b, the collector electrode of the IGBT element 5b, the FWD element 6b, the cathode electrode of the FWD element 6b, the metal foil 4b, and the connection terminal 7a.

The external connection terminal 20 is electrically connected to the emitter electrode of the IGBT element 5a and the anode electrode of the FWD element 6a through the terminal holder 8c, the metal foil 4b, and the connection terminal 7a. Moreover, the external connection terminal 20 is electrically connected to the collector electrode of the IGBT element 5b and the cathode electrode of the FWD element 6b through the terminal holder 8c and the metal foil 4b.

A space surrounded by the resin case 11 and the metal base plate 1 is filled with a sealing resin (not shown) for the purpose of protecting the semiconductor elements, the connection terminals 7a and 7b, and the wire 13. Here, the sealing resin is formed of a resin containing gel or an epoxy resin, for example, as its main component.

The external connection terminals 18, 19, and 20 and the terminal holders 8a, 8b, and 8c are formed of material containing copper (Cu), aluminum (Al), or alloys thereof, for example, as its main component. The external connection terminals 18, 19, and 20 are insert-molded into the lid plate 16.

As described above, the semiconductor device 100 includes the lid 21 that includes the lid plate 16 and a plurality of external connection terminals 18, 19, and 20 provided in the lid plate 16, the resin case 11, at least one semiconductor element (for example, the IGBT element, or the like) packaged in the resin case 11, and the terminal holders 8a, 8b, and 8c that electrically connect the semiconductor element and the external connection terminals 18, 19, and 20 to each other. Although each of the external connection terminals 18, 19, and 20 is connected to each of the terminal holders 8a, 8b, and 8c in FIGS. 1A and 1B, two or more external connection terminals may be connected to each of the terminal holders 8a, 8b, and 8c so as to correspond to a plurality of loads.

In this way, by covering the resin case 11 with the lid 21 in which the positions of the external connection terminals 18, 19, and 20 are changed without changing the layout of the wirings in the resin case 11 and fixing the terminal holders 8a, 8b, and 8c in the resin case 11 to the external connection terminals 18, 19, and 20, respectively, the positions of the external connection terminals 18, 19, and 20 used in the semiconductor device 100 can be freely changed easily.

Moreover, by setting the positions of the terminal holders 8a, 8b, and 8c to the central part of the resin case 11, it is possible to decrease the wiring inductance in the resin case 11. For example, as shown in FIG. 2A, it is preferable to dispose a group of three conductive patterns which include the metal foils 4a and 4b having an approximately L or C-shaped planar shape and the metal foil 4c having a circular planar shape formed between these metal foils on the insulating plate 3 so as to connect the terminal holders 8a, 8b, and 8c onto the respective metal foils.

Moreover, by disposing the external connection terminals (for example, the external connection terminals 18 and 19) in a parallel flat plate-like shape, it is possible to decrease the wiring inductance. Although not shown, a shielding plate may be disposed on the lid 21. By disposing the shield plate on the lid 21, it is possible to reduce high-frequency noise occurring during switching.

Figure 6A:
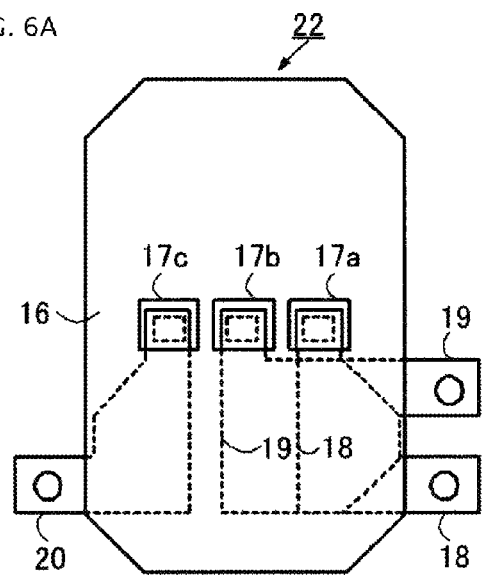
FIGS. 6A to 6D are plan views illustrating another example of members constituting the semiconductor device according to the first embodiment of the invention.
Figure 6B:
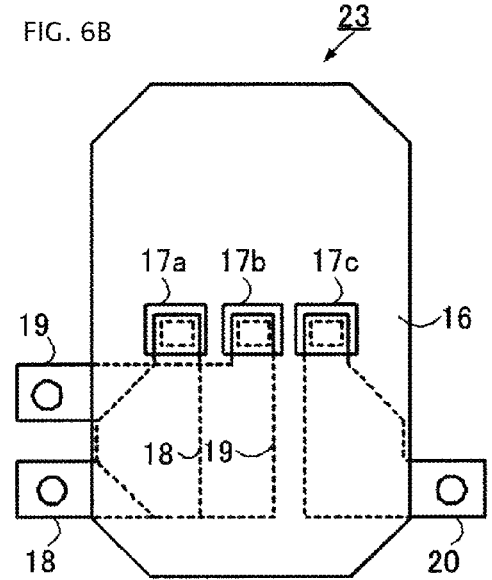

FIGS. 6A to 6D are plan views showing another example of members constituting the semiconductor device according to the first embodiment. FIGS. 6A to 6D show plan views of main parts of lids 22 to 25 which are different from the lid 21 shown in FIGS. 5A and 5B with regard to the layout of the external connection terminals 18, 19, and 20. The lid 22 shown in FIG. 6A shows a case in which when the lid 22 is disposed in the resin case 11, the external connection terminals 18, 19, and 20 are disposed closer to the IGBT element 5b side (the lower half part of the drawing) than the central part of the lid 22. The protruding directions of the end portions of the external connection terminals 18, 19, and 20 in which the external connection hole is formed are the same as those of the lid 21 shown in FIGS. 5A and 5B. The lid 23 shown in FIG. 6B shows a case in which the layout of the external connection terminals 18, 19, and 20 of the lid 22 shown in FIG. 6A is reversed horizontally. That is, the protruding directions of the end portions of the external connection terminals 18, 19, and 20 in which the external connection hole is formed are opposite to those of the lid 22 shown in FIG. 6A.

Figure 6C:
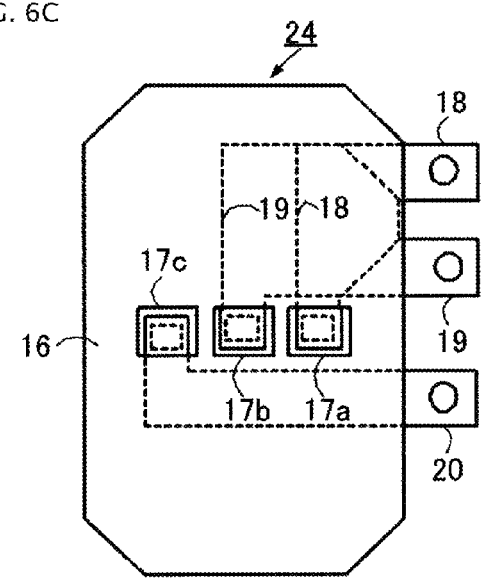
Figure 6D:
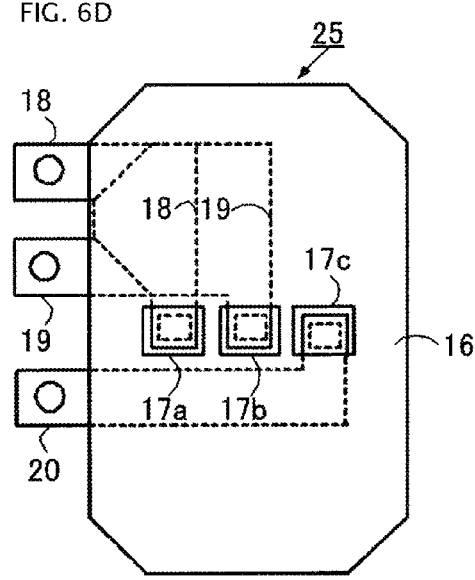

The lid 24 shown in FIG. 6C shows a case in which the three external connection terminals 18, 19, and 20 are disposed on one side wall of the lid 24. The end portions of the external connection terminals 18, 19, and 20 in which the external connection hole is formed protrude outward from the side wall of the lid 24 on the side where the external connection terminals 18, 19, and 20 are disposed. The lid 25 shown in FIG. 6D shows a case in which the layout of the external connection terminals 18, 19, and 20 of the lid 24 shown in FIG. 6C is reversed horizontally. That is, the protruding directions of the end portions of the external connection terminals 18, 19, and 20 in which the external connection hole is formed are opposite to those of the lid 24 shown in FIG. 6C. The other configurations of the lids 22 to 25 shown in FIGS. 6A to 6D are the same as those of the lid 21 shown in FIGS. 5A and 5B.

As above, by exchanging the lid of the semiconductor device 100, the positions of the external connection terminals 18, 19, and 20 can be freely changed even when the same resin case 11 is used. Moreover, as above, by exchanging only the lid to which the external connection terminals 18, 19, and 20 are fixed, the positions of the external connection terminals 18, 19, and 20 of the semiconductor device 100 can be changed easily. In the first embodiment, although a semiconductor device corresponding to one phase of the inverter circuit has been illustrated as an example, when configuring three phases of the inverter circuit, three semiconductor devices 100 shown in FIGS. 1A and 1B may be arranged and used.

FIGS. 7A and 7B are configuration views showing another example of the semiconductor device according to the first embodiment of the invention. FIG. 7A is a plan view of main parts, and FIG. 7B is a side view of a cross-section taken along the line X-X in FIG. 7A as viewed from the direction of arrows. As shown in FIGS. 7A and 7B, semiconductor elements corresponding to three phases (U, V, and W phases) may be packaged into a resin case 11a to form a semiconductor device 100a. In this case, the external connection terminals 18, 19, and 20 provided for the respective phases are connected to each other.

As described above, according to the first embodiment, by preparing a plurality of lids 21 to 25 having different layouts of the external connection terminals 18, 19, and 20 in which all external connection terminals 18, 19, and 20, which are main terminals through which main current flows, are disposed on a lid, and the external connection terminals 18, 19, and 20 are connected to the terminal holders 8a, 8b, and 8c in the resin case 11, respectively, and exchanging the lids 21 to 25, it is possible to easily change the positions of all external connection terminals 18, 19, and 20 which are the main terminals.

Moreover, by setting the positions of the terminal holders 8a, 8b, and 8c to the central part of the resin case 11, it is possible to decrease the wiring inductance in the resin case 11. Moreover, since the openings 17a, 17b, and 17c are formed at the central part of the lid plate 16 when either one of the lids 21 to 25 is disposed in the resin case 11, by irradiating laser light from the openings 17a, 17b, and 17c, the external connection terminals 18, 19, and 20 can be easily laser-welded to the terminal holders 8a, 8b, and 8c, respectively. Furthermore, by disposing the external connection terminals 18 and 19 which serve as P and N terminals, for example, in a parallel flat plate-like shape, it is possible to decrease the wiring inductance.

Second Embodiment

Figure 8A:
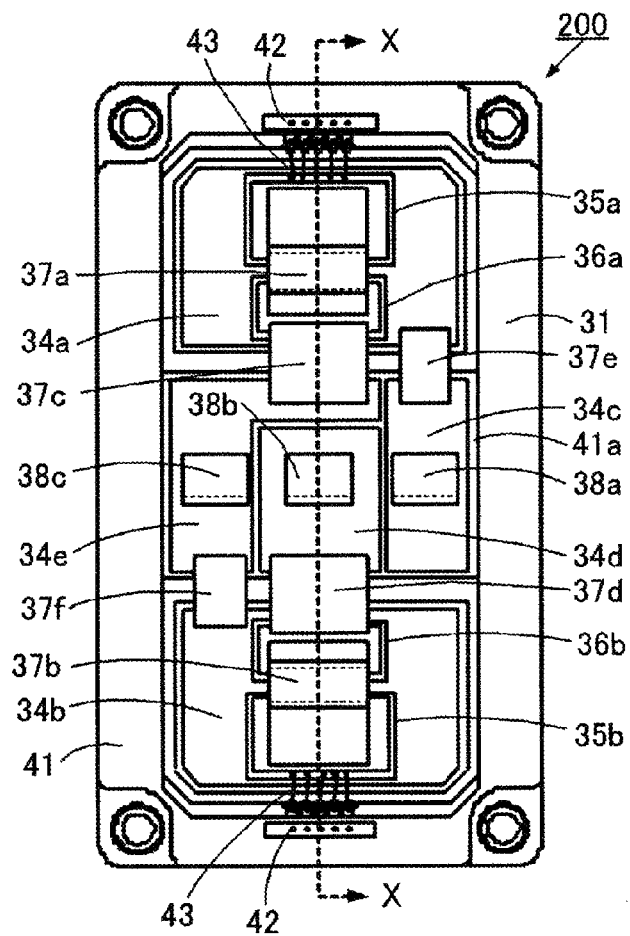
FIGS. 8A and 8B are configuration views illustrating a semiconductor device according to a second embodiment of the invention.
Figure 8B:
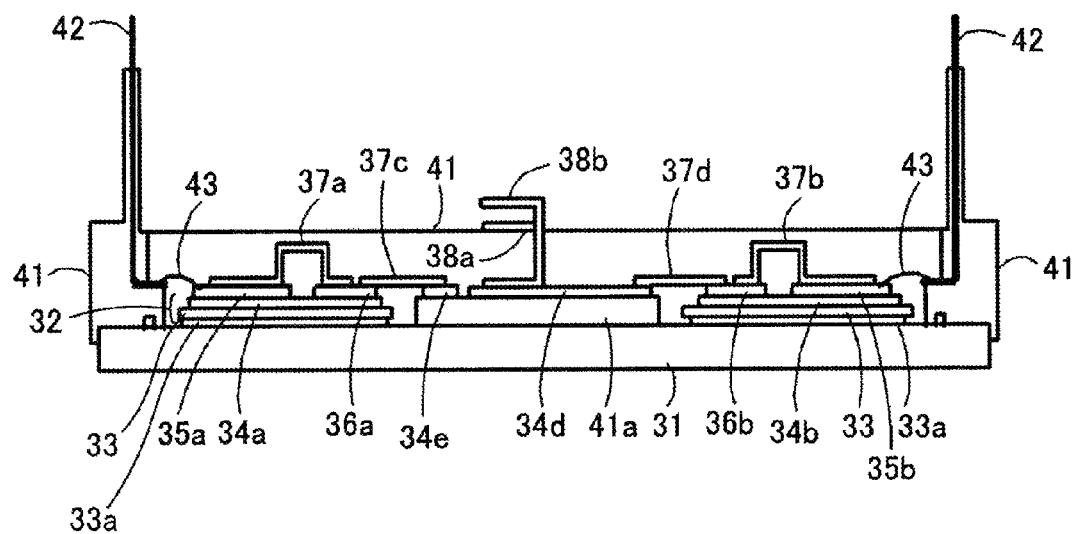
Figure 9A:
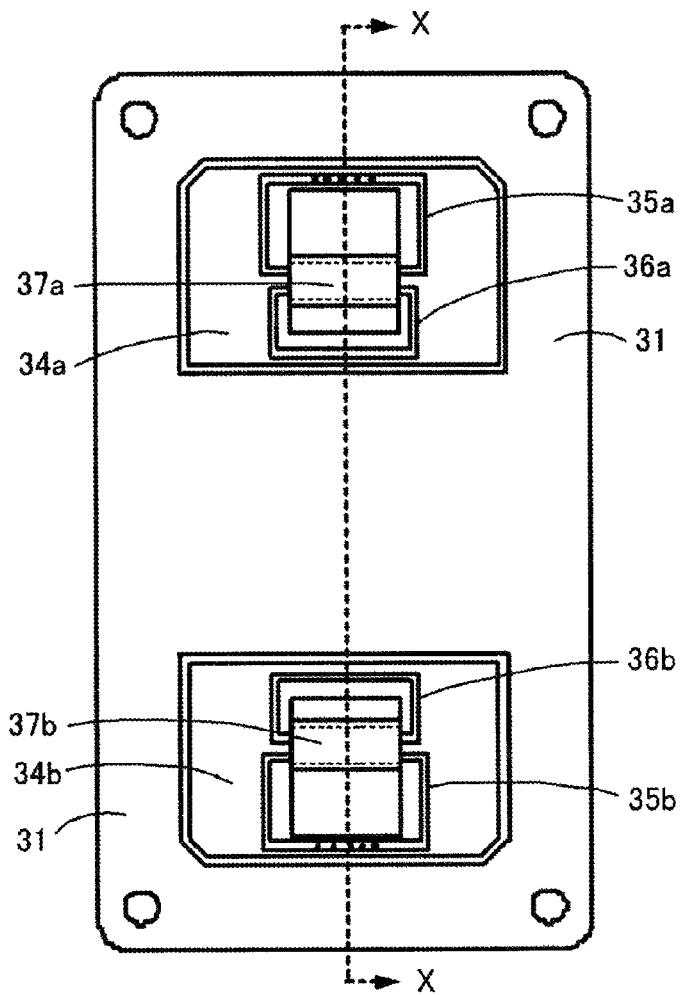
FIGS. 9A and 9B are configuration views illustrating members constituting the semiconductor device according to the second embodiment of the invention.
Figure 9B:
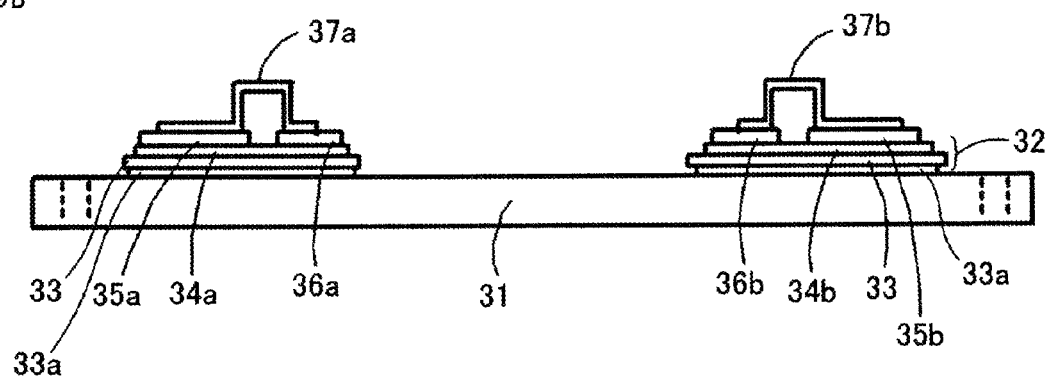
Figure 10A:
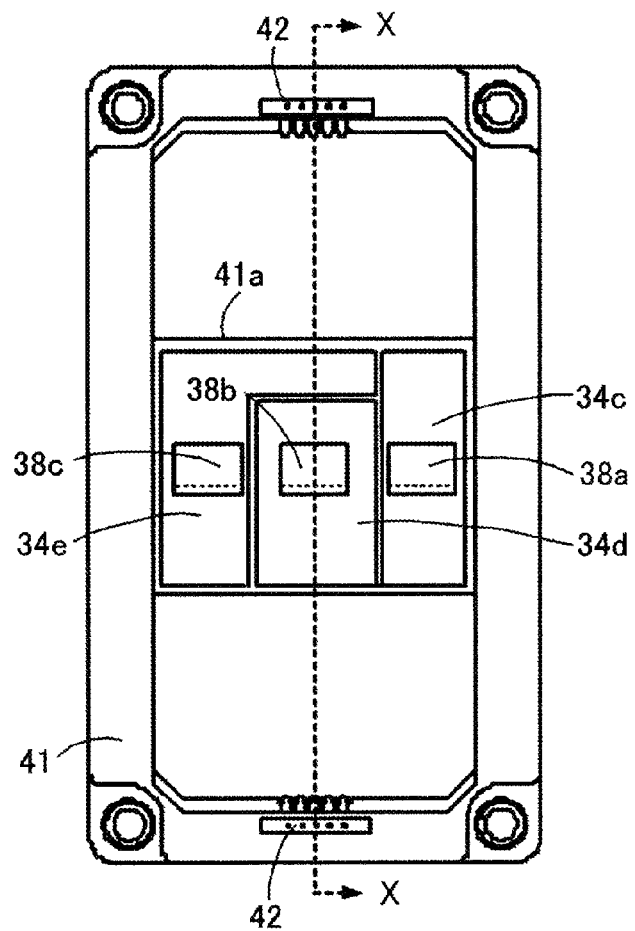
FIGS. 10A and 10B are configuration views illustrating members constituting the semiconductor device according to the second embodiment of the invention.
Figure 10B:
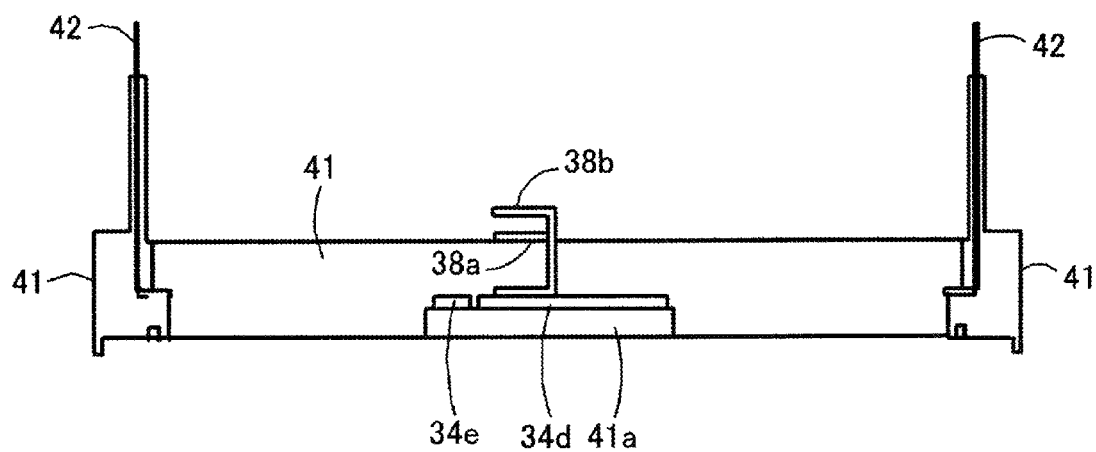
Figure 11:
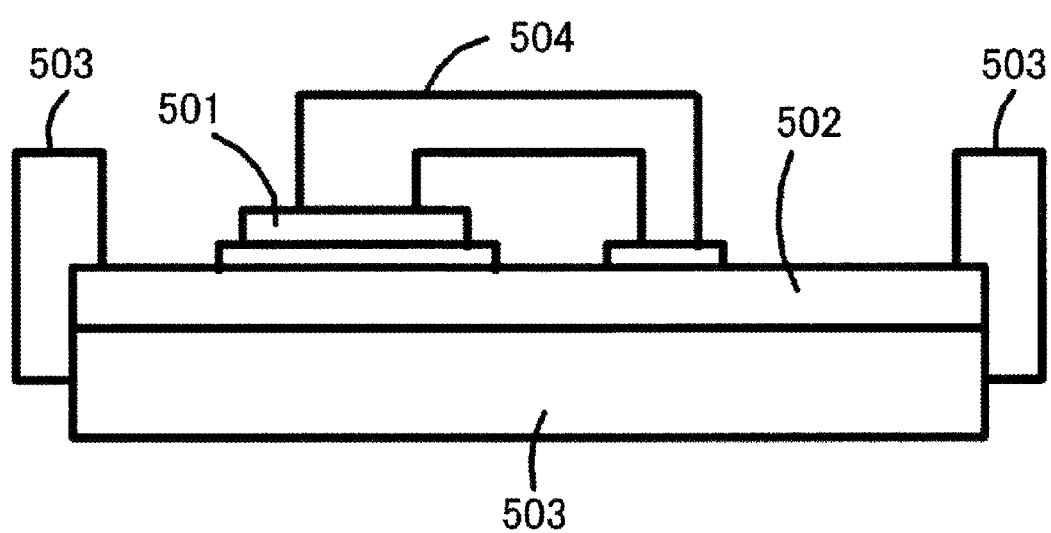
FIG. 11 is a configuration view illustrating main parts of a semiconductor device of the related art, in which a power semiconductor element is packaged in a resin case.
Figure 12A:
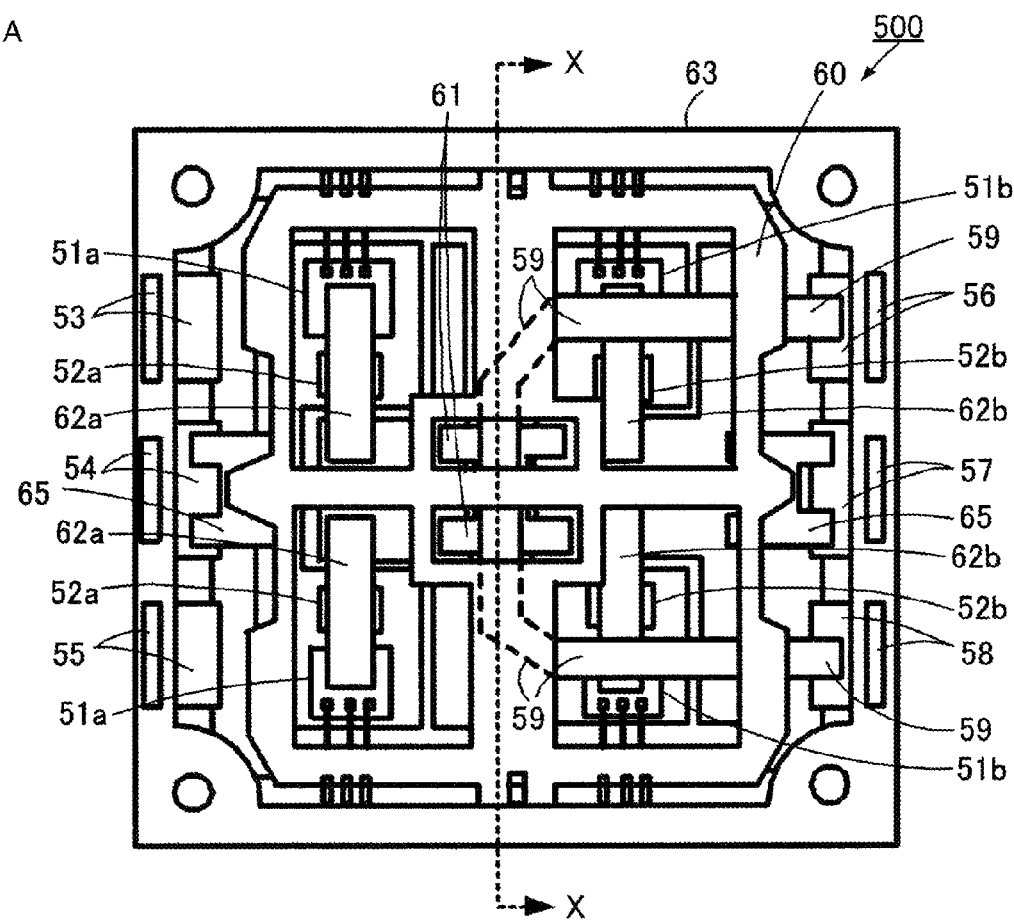
FIGS. 12A and 12B are configuration views illustrating the semiconductor device of the related art.
Figure 12B:
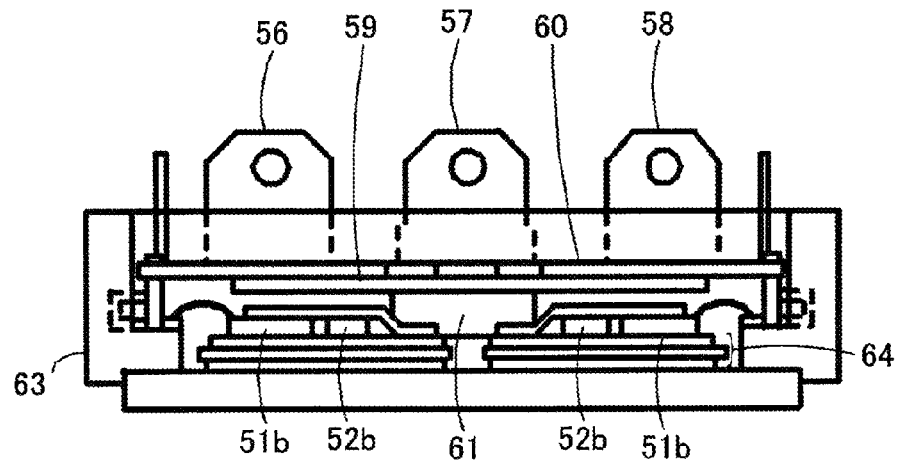

FIGS. 8A and 8B are configuration views showing a semiconductor device according to a second embodiment of the invention. Moreover, FIGS. 9A to 10B are configuration views showing members constituting the semiconductor device according to the second embodiment of the invention. FIGS. 8A and 8B are overall configuration views after a semiconductor device 200 is assembled. In FIGS. 8A and 8B, illustration of a lid is not provided. FIGS. 9A and 9B are configuration views of an insulating substrate 32 to which semiconductor elements are fixed. FIGS. 10A and 10B are configuration views of a resin case 41. The semiconductor device shown in FIGS. 8A and 8B is different from the semiconductor device 100 (see FIGS. 1A and 1B) of the first embodiment in that terminal holders 38a, 38b, and 38c are fixed and supported on conductive foils 34c, 34d, and 34e (for example, metal foils) that are fixed to a resin plate 41a which is a part of the resin case 41.

In the semiconductor device 200 shown in FIGS. 8A and 8B, two insulating substrates 32 are separated from each other and fixed onto the metal base plate 31 through a solder layer (not shown). One insulating substrate 32 of the two insulating substrates 32 includes a metal foil 34a which is a conductive pattern formed on the upper surface of the insulating plate 33, and the other insulating substrate 32 includes a metal foil 34b which is a conductive pattern formed on the upper surface of the insulating plate 33.

In the resin case 41, a group of three conductive foils (conductors) 34c, 34d, and 34e are fixed to the resin plate 41a which is a part of the resin case 41. Furthermore, the terminal holders 38a, 38b, and 38c are fixed to the conductive foils 34c, 34d, and 34e, respectively. The resin plate 41a is fixed to the inner walls of the resin case 41 while bridging the central portions of the openings of the resin case 41. Moreover, the resin plate 41a is disposed between the two insulating substrates 32, for example, when the resin case 41 is provided on the metal base plate 31. The lid not shown is the same as the lids 21 to 25 shown in the first embodiment (see FIGS. 5A to 6D).

When assembling the semiconductor device 200, semiconductor elements and the like are packaged into the resin case 41, either one of the lids 21 to 25 is placed on the resin case 41, and the external connection terminals 18, 19, and 20 which are fixed and supported on the lid plate 16 are fixed to the terminal holders 38a, 38b, and 38c, respectively, whereby the semiconductor device 200 is manufactured.

A conductive plate may be used instead of the conductive foil 34c and the like, the terminal holders 38a, 38b, and 38c are formed to be integral using a part of the conductive plate, and the conductive plate having the terminal holders attached thereto may be fixed to the resin case 41. By fixing the conductive plate having the terminal holders attached thereto to the resin case 41 instead of the conductive foil 34c and the like, it is possible to reduce the manufacturing cost.

In the drawing, reference numeral 33a is a metal foil on the lower surface of the insulating plate 33, 35a and 35b are IGBT elements, 36a and 36b are FWD elements, 37a, 37b, 37c, 37d, 37e, and 37f are connection terminals, 42 is a control terminal, and 43 is a wire. The metal foil 33a corresponds to the metal foil 3a of the first embodiment (see FIGS. 1A and 1B). The metal foils 34a and 34b correspond to the metal foils 4a and 4b of the first embodiment, respectively. The IGBT elements 35a and 35b and the FWD elements 36a and 36b correspond to the IGBT elements 5a and 5b and the FWD elements 6a and 6b of the first embodiment, respectively.

The connection terminals 37a and 37b correspond to the connection terminals 7a and 7b of the first embodiment, respectively. The connection terminal 37c is in contact with the FWD element 36a and the conductive foil 34e. The connection terminal 37d is in contact with the FWD element 36b and the conductive foil 34d. The connection terminal 37e is in contact with the metal foil 34a and the conductive foil 34c. The connection terminal 37f is in contact with the metal foil 34b and the conductive foil 34e. The control terminal 42 and the wire 43 correspond to the control terminal 12 and the wire 13 of the first embodiment, respectively. The other configurations are the same as those of the first embodiment.

As described above, according to the second embodiment, it is possible to obtain the same effects as the first embodiment. Moreover, by forming the terminal holders 38a, 38b, and 38c on the bridging portion (the resin plate 41a) of the resin case 41, even when the external connection terminals 18, 19, and 20 are fixed to the terminal holders 38a, 38b, and 38c whereby large stress occurs, the stress is transmitted to the IGBT elements 35a and 35b and the FWD elements 36a and 36b through the metal base plate 31 and the resin plate 41a bridging the openings of the resin case 41. Thus, the stress is reduced greatly, and stress-related deterioration of properties of the IGBT elements 35a and 35b and the FWD elements 36a and 36b can be prevented.

Moreover, the insulating substrate 32 can save the area occupied by the conductive foils 34c, 34d, and 34e to which the terminal holders are fixed. Thus, it is possible to suppress the manufacturing cost to be low as compared to the first embodiment.

In the invention, while the inverter circuit has been described as an example, the invention is not limited to the embodiments described above but can be applied to circuit having various other configurations.

As described above, a semiconductor device according to certain embodiments of the invention is beneficial for semiconductor devices which are provided independently of a main body of an apparatus such as an inverter apparatus, an uninterruptible power supply, a machine tool or an industrial robot, and in which a plurality of semiconductor elements is packaged (housed) in a resin case.

Examples of specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the above description, specific details are set forth in order to provide a thorough understanding of embodiments of the invention. Embodiments of the invention may be practiced without some or all of these specific details. Further, portions of different embodiments and/or drawings can be combined, as would be understood by one of skill in the art.

What is claimed is:

1. A semiconductor device comprising:
a resin case;
an insulating lid fixed and supported on the resin case;
an insulating substrate which is housed in the resin case and which includes a plurality of conductive patterns;
a semiconductor element fixed to at least one of the conductive patterns;
a plurality of connection conductors connecting the conductive patterns together and connecting surface electrodes of the semiconductor element and the conductive patterns;
terminal holders connected to the conductive patterns; and
external connection terminals connected to the terminal holders,
wherein the lid includes the external connection terminals and a lid plate that fixes and supports the external connection terminals.

2. A semiconductor device comprising:
a resin case;
an insulating lid fixed and supported on the resin case;
an insulating substrate which is housed in the resin case and which includes a plurality of conductive patterns;
a semiconductor element fixed to at least one of the conductive patterns;
a plurality of connection conductors connecting the conductive patterns together and connecting surface electrodes of the semiconductor element and the conductive patterns;
a resin plate which bridges openings of the resin case and which is fixed to inner walls of the resin case;
conductors disposed on the resin plate;
terminal holders connected to the conductors; and
external connection terminals connected to the terminal holders,
wherein the lid includes the external connection terminals and a lid plate that fixes and supports the external connection terminals.

3. The semiconductor device according to claim 1,
wherein the lid plate includes an opening,
wherein the opening is formed at a central part of the lid plate, and
wherein the external connection terminals and the terminal holders exposed from the opening are connected to each other.

4. The semiconductor device according to claim 2, wherein the lid plate includes an opening,
wherein the opening is formed at a central part of the lid plate, and
wherein the external connection terminals and the terminal holders exposed from the opening are connected to each other.

5. The semiconductor device according to claim 2,
wherein the terminal holders are parts of the conductors.

6. The semiconductor device according to claim 1,
wherein the conductive patterns include a first conductive pattern, a second conductive pattern, and a third conductive pattern,
wherein the semiconductor element includes a first IGBT element, a second IGBT element, a first FWD element, and a second FWD element,
wherein the terminal holders include a first terminal holder, a second terminal holder, and a third terminal holder,
wherein a collector electrode of the first IGBT element and a cathode electrode of the first FWD element are fixed to the first conductive pattern,
wherein a collector electrode of the second IGBT element and a cathode electrode of the second FWD element are fixed to the second conductive pattern,
wherein an emitter electrode of the first IGBT element and an anode electrode of the first FWD element are electrically connected to the second conductive pattern,
wherein an emitter electrode of the second IGBT element and an anode electrode of the second FWD element are electrically connected to the third conductive pattern, wherein the first terminal holder is connected to the first conductive pattern, wherein the second terminal holder is connected to the second conductive pattern, wherein the third terminal holder is connected to the third conductive pattern, and wherein at least one external connection terminal is connected to each of the first terminal holder, the second terminal holder, and the third terminal holder.

7. The semiconductor device according to claim 2, wherein the conductive patterns include a first conductive pattern, a second conductive pattern, and a third conductive pattern, wherein the semiconductor element includes a first IGBT element, a second IGBT element, a first FWD element, and a second FWD element, wherein the terminal holders include a first terminal holder, a second terminal holder, and a third terminal holder, wherein the conductors include a first conductor, a second conductor, and a third conductor, wherein a collector electrode of the first IGBT element and a cathode electrode of the first FWD element are fixed to the first conductive pattern, wherein a collector electrode of the second IGBT element and a cathode electrode of the second FWD element are fixed to the second conductive pattern, wherein the first conductive pattern and the first conductor are electrically connected to each other, wherein an emitter electrode of the first IGBT element, an anode electrode of the first FWD element, and the second conductive pattern are electrically connected to the second conductor, wherein an emitter electrode of the second IGBT element and an anode electrode of the second FWD element are electrically connected to the third conductor, wherein the first terminal holder is connected to the first conductor, wherein the second terminal holder is connected to the second conductor, wherein the third terminal holder is connected to the third conductor, and wherein at least one external connection terminal is connected to each of the first terminal holder, the second terminal holder, and the third terminal holder.

8. The semiconductor device according to claim 1, wherein the terminal holders and the external connection terminals are fixed by ultrasonic bonding, laser welding, or soldering.

9. The semiconductor device according to claim 2, wherein the terminal holders and the external connection terminals are fixed by ultrasonic bonding, laser welding, or soldering.

10. The semiconductor device according to claim 1, further comprising:

a group of three conductive patterns including a first conductive pattern, a second conductive pattern, and a third conductive pattern;

the semiconductor elements including a first semiconductor element fixed to the first conductive pattern and a second semiconductor element fixed to the second conductive pattern;

the third conductive pattern formed between the first conductive pattern and the second conductive pattern;

the terminal holders including a first terminal holder, a second terminal holder, and a third terminal holder which are connected to the first conductive pattern, the second conductive pattern, and the third conductive pattern, respectively; and the external connection terminals which are connected to the first terminal holder, the second terminal holder, and the third terminal holder, respectively, and of which the end portions protrude outward from the resin case.

11. The semiconductor device according to claim 2, further comprising:

the conductive patterns including a first conductive pattern and a second conductive pattern;

the insulating substrate including a first insulating substrate having the first conductive pattern and a second insulating substrate having the second conductive pattern;

the semiconductor elements including a first semiconductor element fixed to the first conductive pattern and a second semiconductor element fixed to the second conductive pattern;

a resin plate disposed between the first insulating substrate and the second insulating substrate;

a group of three conductors including a first conductor, a second conductor, and a third conductor, disposed on the resin plate;

the terminal holders including a first terminal holder, a second terminal holder, and a third terminal holder which are connected to the first conductor, the second conductor, and the third conductor, respectively; and the external connection terminals which are connected to the first terminal holder, the second terminal holder, and the third terminal holder, respectively, and of which the end portions protrude outward from the resin case.

* * * * *